United States Patent

[11] 3,614,549

[72] Inventors Max R. Lorenz
Mahopac;
Arthur H. Nethercot, Jr., Hastings on Hudson, both of N.Y.
[21] Appl. No. 767,742
[22] Filed Oct. 15, 1968
[45] Patented Oct. 19, 1971
[73] Assignee International Business Machines Corporation
Armonk, N.Y.

[54] A SEMICONDUCTOR RECOMBINATION RADIATION DEVICE
11 Claims, 9 Drawing Figs.

[52] U.S. Cl. .......... 317/234, 317/235, 148/177
[51] Int. Cl. .......... H01l 15/00
[50] Field of Search .......... 317/235 (27), 235, 235 (42)

[56] References Cited
UNITED STATES PATENTS
3,436,625 4/1969 Newman .......... 317/237
3,416,047 12/1968 Beale .......... 317/234

*Primary Examiner*—James D. Kallam
*Assistant Examiner*—Martin H. Edlow
*Attorneys*—Hanifin and Clark and John E. Dougherty, Jr.

ABSTRACT: The diode is a formed alloy of InP and GaP doped to provide a PN junction. A forward bias is applied to produce radiation in the green. The alloy provides efficient direct transition radiation even though it includes more of the indirect GaP semiconductor GaP than the direct gap semiconductor InP. For an output of about 2.2 electron-volts, the alloy includes about 80 percent gap and about 20 percent InP. This highly visible output is achievable with this alloy because the energy difference between the (000) aligned (direct) conduction band minima and the (100) misaligned (indirect) conduction band minima in InP is greater than the energy difference between the corresponding aligned and the misaligned minima in GaP. Also, the energy level for the misaligned minima in InP is essentially at the same energy level as the misaligned minima in GaP. Diodes are also formed of alloys of other III–V compounds.

INVENTORS
MAX R. LORENZ
ARTHUR H. NETHERCOT, JR.

BY

ATTORNEY

A SEMICONDUCTOR RECOMBINATION RADIATION DEVICE

The invention relates to devices for producing light output as a result of the recombination of charge carriers in a semiconductor body; more specifically the invention pertains to PN junction devices formed of alloys of III–V compounds which, in response to the application of a forward bias, produce efficient direct gap recombination radiation in the most visible portion of the electromagnetic spectrum.

Much attention has been directed in recent years to light-producing devices. These devices have many applications, whether operated in a lasing or nonlasing mode. Relatively high efficiency recombination radiation has been produced in PN junctions in GaAs as well as in alloys of GaAs with other III–V compounds. GaAs has been used extensively since it exhibits the largest direct gap of all the electroluminescent materials which can be made into PN junction devices. Therefore, this material has been considered to offer the best possibility for efficiently producing light output in the more visible portions of the electromagnetic spectrum. The best results thus far achieved have been with gallium-aluminum-arsenide alloys and gallium-arsenide-phosphide alloys, in both of which cases the light output for direct transitions is below 1.90 electron volts. Although this output is just at the edge of the visible portion of the spectrum, it is not at a wavelength which is easily visible to the human eye.

It has been discovered that efficient direct gap recombination radiation can be produced in alloys gas other III–V semiconductor compounds if the constituents for the alloy are properly chosen and mixed in the correct percentages. More specifically, in such alloys the criteria for producing light outputs at shorter wave lengths in the most visible portion of the electromagnetic spectrum, e.g., green light, has been found not to be solely dependent on the width of the band gap of the direct gap compound, such as GaAs, and the width of the band gap of the indirect gap compound such as, for example, GaP or AlAs. Rather, it has been found that higher outputs can be achieved using as the direct gap component in the alloy a material which has a relatively low direct gap transition, but which also exhibits a conduction band minima in another crystalline direction which is relatively high and separated from the direct gap conduction band minima by a significant energy.

For example, the direct gap energy in InP between the (000) valence band minimum and the (000) aligned conduction band minimum is about 1.34 electron volts. However, the conduction band minima in the (100) direction in InP is about 2.24 electron volts above the (000) valence band maximum. Therefore, the energy difference between these two conduction band minima, which will hereinafter be referred to as the aligned and misaligned minima, is approximately 0.9 electron volts. GaP is an indirect gap semiconductor having a misaligned minimum at about 2.26 electron volts and an aligned minimum at about 2.74 electron volts. The difference between the misaligned and aligned material is therefore about 0.5 electron volts.

In accordance with the teaching of this invention these two materials can be alloyed together to provide an alloy, $In_{1-x}Ga_xP$, in which direct gap recombination radiation can be produced in a PN structure at an energy as high as 2.2 electron volts which is well in the green. This highly visible type of output is realized since, in the alloy components, the difference in energy between the aligned and misaligned minima in the direct gap material, InP, is greater than the difference in energy between the aligned and misaligned minima in the indirect material, GaP. Further, the misaligned minima in InP at 2.24 electron volts is almost equal in energy to the misaligned minima in GaP phosphide at 2.2 electron volts. The particular alloy compositions which yield the highest wave length outputs are those in which there is much more of the indirect gap material (GaP) present than the direct material (InP). At the same time, the alloys produce efficient direct gap recombination.

Other alloys having similar characteristics can also be formed, and used to fabricate electroluminescent diodes. Examples are $Ga_{1-x}Al_xSb_xP$, $In_{1-x}Al_xAs$, $In_xAl_{1-x}P$, $Ga_{1-x}Al_xSb$, and $In_{1-x}Al_xSb$. The latter two alloy systems, though they do not provide outputs of as high energies as the other alloys, are of interest since each of these alloys can be prepared to provide direct gap radiative transitions at an energy which is higher than the energy of the transitions achievable with either the direct gap or indirect gap component of the alloy.

Therefore it is an object of the present invention to provide improved recombination radiation devices.

It is a more specific object of this invention to provide recombination radiation devices formed of alloys which provide direct gap radiation at energies corresponding to the more visible portions of the electromagnetic spectrum. These alloys are alloys of III–V compounds in which PN junctions can be formed.

It is a specific object of the present invention to provide a PN junction electroluminescent diode which produces efficient direct gap recombination radiation in that portion of the electromagnetic spectrum, corresponding to green light, to which the human eye is most responsive.

The foregoing and other objects, features, and advantages of the invention will be apparent from the following more particular description of preferred embodiments of the invention, as illustrated in the accompanying drawings.

DESCRIPTION OF THE DRAWINGS

FIG. 1 is a schematic representation of an electroluminescent diode. The diode is formed of a body of semiconductor material which includes a P region 10, an N region 12 and a PN junction 14 between these regions. A forward bias is applied across the junction through a pair of ohmic contacts 16 which are connected to a variable voltage source represented by battery 18 and resistor 20. The diode shown is not formed to be a Fabry-Perot type structure since the primary application of the diodes of the present invention is in light displays which do not require lasing outputs. However, it will be apparent to those skilled in the art that the diodes of the present invention, since they produce efficient direct gap recombination radiation, are of the type that can be used in injection laser applications.

Figure 1:
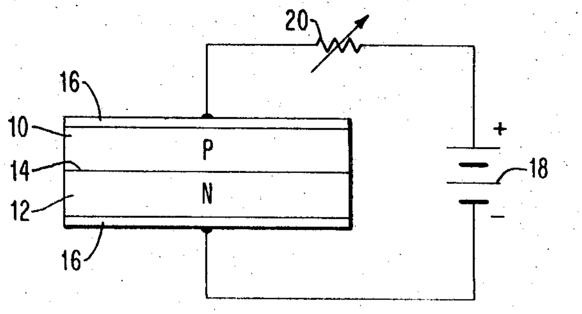
FIG. 1 is a schematic representation of an electroluminescent diode.

Electroluminescence is produced in the diode of FIG. 1 when the forward bias is sufficient to inject carriers across the junction; usually electrons from the N region 12 to the P region 10. These electrons are injected into the P region and combine with holes in that region to produce recombination radiation. The energy of the radiation, and therefore its wavelength, is determined by the energy transition involved with this recombination. Generally speaking, where the transition is not between deep lying impurity centers, the energy transition is close to the band gap of the semiconductor material of which the diode is made.

The efficiency of light production depends upon a number of factors, a primary one of which is the nature of the recombination radiation transition. Specifically, the efficiency is higher for semiconductors having a direct band gap than for semiconductors having an indirect gap. Therefore, even though indirect gap semiconductors are known which have a large band gap and can be used as diodes which provide some short wave length radiations in the more visible portions of the electromagnetic spectrum, these diodes are rather inefficient. Conversely, the direct gap semiconductors, which can be used to provide efficient recombination radiation and which can be doped to form PN junction diodes, have relatively small band gaps and emit light in the infrared. The most widely used semiconductors in electroluminescent diodes are the III–V compounds. Alloys of these compounds include one direct gap semiconductor and one indirect gap semiconductor and have been made which provide direct gap recombination in the red. However, prior to this invention, efficient direct gap radiation has not been produced in electroluminescent PN junction diodes in the more visible (to the human eye) portions of the spectrum, specifically green light.

Figure 2:
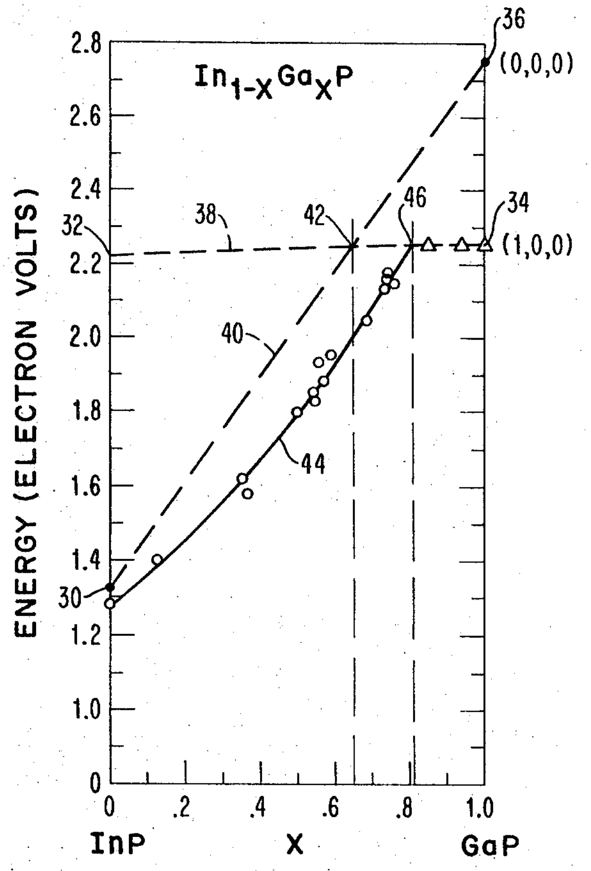
FIG. 2 is a graphical representation of the energy characteristics of the alloy system $In_{1-x}Ga_xP$, and illustrates the composition ranges in which this alloy is a direct band gap semiconductor at an energy corresponding to green radiation.

FIG. 2 is a graphic representation of the alloy $In_{1-X}Ga_XP$. Single crystal alloys in this system are made of a solid solution of two components. The first component is InP which is a direct gap semiconductor and the second component is GaP which is an indirect gap semiconductor. The value X, which is indicative of the particular proportions of these two constituents, is plotted as the abscissa in FIG. 2. The energy levels of the various minima which also indicate the energy involved in radiative transitions in the material, are plotted as the ordinate.

By a direct gap material, it is meant that the conduction band minimum having the lowest energy for electrons is at the same position in *k* space as the valence band maximum having the highest energy for electrons and the lowest energy for holes. This is illustrated in FIG. 3A with the valence band curve being designated 22 and the conduction band curve being designated 24. The direct gap, which is at (000 ) in *k* space, is a gap of 1.34 electron volts between the valence band maximum 22A and the conduction band minimum 24A. In InP there are also second conduction band minima in the (000) direction in the material. One such minimum is shown at 24B in FIG. 3A. Since this minimum exists in a different position in momentum space relative to the valence band maximum it is an indirect gap minimum. Hereinafter, the direct gap conduction band minima will be referred to as aligned, and the indirect gap conduction band minima will be referred to as misaligned. The (100) misaligned conduction band minimum of InP shown in FIG. 2 is at an energy level 2.24 electron volts above the valence band maximum. Thus, it is evident from this figure that the smallest energy between valence and conduction bands in InP is the direct gap at (000).

GaP is an indirect gap material by which it is meant that the lowest conduction band minimum is misaligned with the valence band maximum. This is illustrated in FIG. 3B in which the conduction band is represented by curve 26 and the valence band by curve 28. As can be seen by this figure, there is a conduction band minimum 26B at (100) which is only 2.26 electron volts above the valence band maximum 28A at (000), whereas the aligned conduction band minimum 26A is 2.74 electron volts higher in energy than the valence band maximum.

Conduction electrons in InP will normally be in the lower minimum 24A which is at (000) and radiative transitions in this material are direct transitions from this minimum to the aligned valence band maximum 22A at (000). Conversely, conduction electrons in GaP are normally in the lower energy conduction band minimum 28B at (100) and transitions of these electrons from this band, which is misaligned with the (000) valence band maximum 28A, are indirect transitions.

In FIG. 2 the energy for the InP conduction band minima are plotted along the left-hand ordinate and for the GaP along the right-hand ordinate. Point 30 corresponds to the direct gap of 1.34 electron volts in InP and point 32 corresponds to the indirect gap energy of 2.24 electron volts. Point 34 in FIG. 2 corresponds to the indirect band gap energy of about 2.26 electron volts for GaP and point .36 corresponds to the higher direct gap energy for the same material of about 2.74 electron volts.

Generally speaking, when two such constituents are mixed together, the conduction band minima along the same crystalline directions in the material have a tendency to affect each other. Thus, as InP and GaP are mixed the direct gap transition at (000) of the lower direct gap material InP is raised in the alloys toward the higher (000) gap in GaP. In a similar manner, the conduction band minima in the (100) directions interact.

It is for this reason that the energy characteristics of an alloy of two such materials can be generally approximated by drawing a straight line curve between the (000) conduction band minima (curve 38 in FIG. 2) and a straight line curve (curve 40 in FIG. 2) between the (100) conduction band minima. The intersection of these curves 42 is taken to denote the composition at which the direct gap along the (000) direction is at the same energy level as the indirect gap along the (100) direction. Point 42 in FIG. 2 is for a composition where X equals about 0.63, that is a composition which includes 63 percent GaP and 27 percent InP. For compositions including a greater amount of InP, the direct gap in the alloy, as represented by straight line curve 40, is less than the indirect gap as represented by curve 38 and the material is a direct gap material. For compositions having a greater amount of GaP and therefore to the right of point 42 in FIG. 2, the indirect gap is at a lower energy and the material is an indirect gap material.

Curve 44 in FIG. 2 is an actual curve illustrating the actual energy gap transitions experimentally realized with the alloy system $In_{1-X}Ga_XP$. As is illustrated by this curve and the intersection point at 46, the alloy system is a direct semiconductor as long as X is equal to or less than about 0.80. Further, and of paramount significance, is the fact that the material is a direct gap material up to this point which corresponds to an energy transition of about 2.25 electron volts. Recombination radiation at 2.25 electron volts is in the green portion of the spectrum, and is in that portion of the spectrum which can be most easily seen by the human eye.

Though the shortest wave length can be realized at a composition denoted where X equals about 0.80, in actual practice it has been found advantageous to fabricate diodes with compositions including somewhat less GaP. A reason for this is thought to be that more of the recombination radiation is absorbed when the indirect gap is at the same energy as the direct gap, and absorption losses can be minimized by fabricating the alloy so that the direct gap has a somewhat smaller energy than an indirect gap.

Figure 3C:
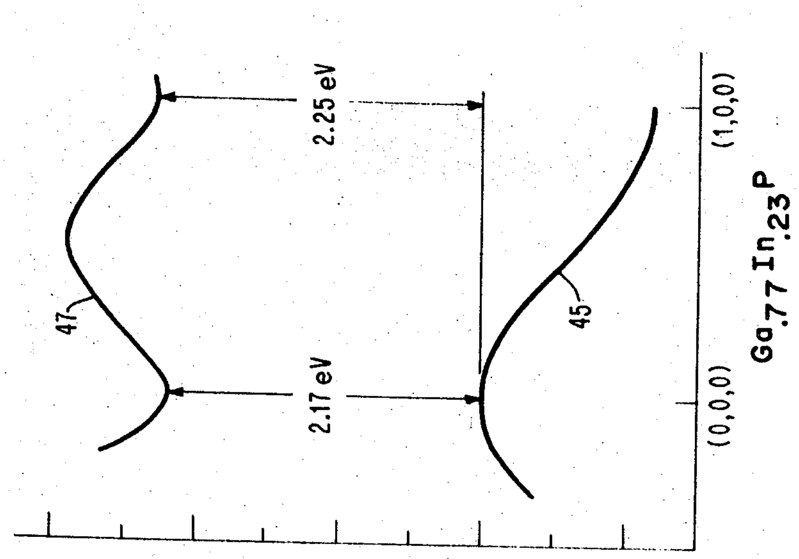
FIGS. 3A, 3B and 3C, respectively, are diagrammatic illustrations of the energy band structure for InP, GaP and the alloy $In_{1-x}Ga_xP$ where X is about 0.77.
Figure 3B:
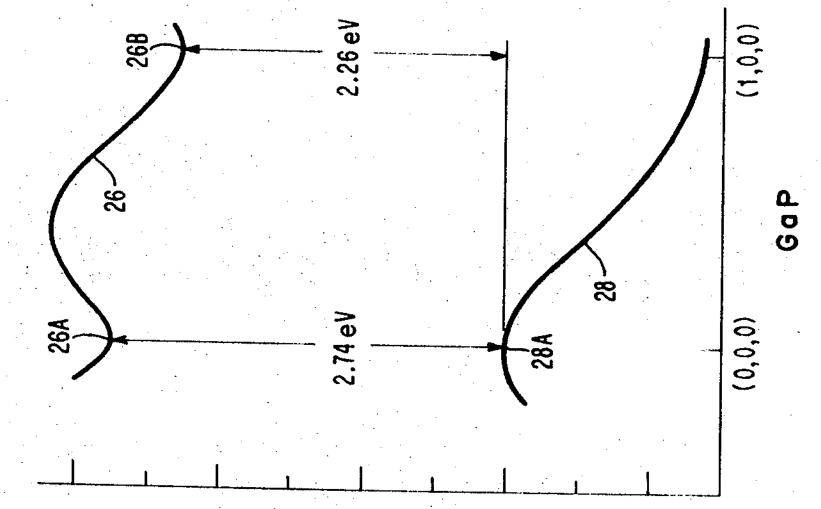
Figure 3A:
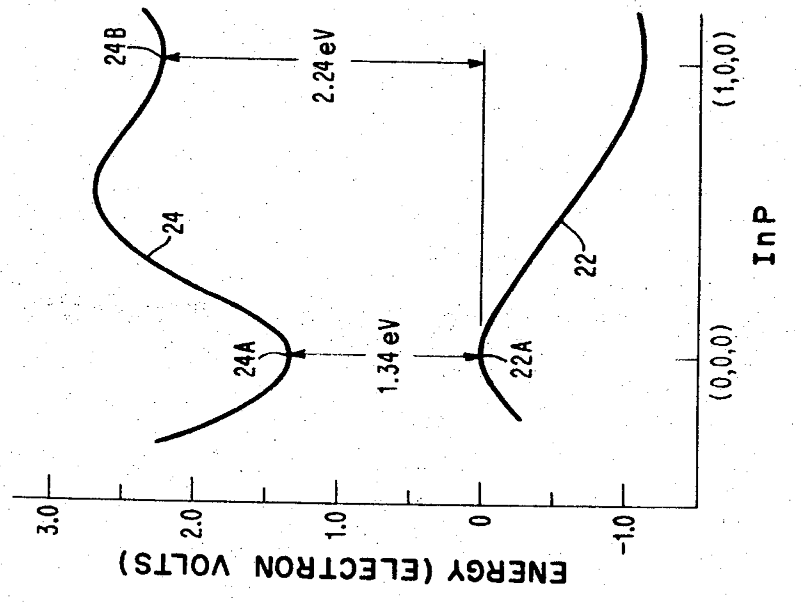

One such alloy is illustrated in FIG. 3C. X is about 0.77, the direct gap and the output radiation are about 2.17 electron volts and the indirect gap is about 2.25 electron volts. As can be seen from the valence band curve 45 and conduction band curve 47, the indirect gap in the alloy is about 0.08 electron volts wider than the direct gap. The more useful operating range in the alloy system of FIG. 2, in terms of producing highly visible radiation by efficient direct gap transitions, is for values of X between 0.60 and 0.80 and particularly in the higher portion of this range. For the range of compositions the light output is at an energy which is at least 85 percent of the indirect energy gap of GaP.

A number of characteristics of the alloy system of FIG. 2 are worthy of note. First it should be noted that the misaligned minima for there two materials represented at points 32 and 34 are almost at the same energy level. Second it should be emphasized that high energy green output can be realized with this alloy system despite the fact that the direct gap component InP has a relatively low direct energy gap (1.34) electron volts. It is more accurate to say that it is because of this low direct band gap, and the further fact that the energy difference between the aligned conduction band minima at 30 and the misaligned conduction band minima at 32 for InP is much greater than the energy difference between the misaligned conduction band minima 34 for GaP and the aligned conduction band minima at 36 for this material. It is for this reason that the intersection of the curves is displaced to the right side of the drawing. Thus, it becomes apparent that in alloy systems of this type, alloys providing higher energy outputs can be realized where the difference in the conduction band energy levels in the direct gap material is much greater than the difference in the conduction band energy levels in the indirect gap material. Of further interest, is the fact that high energy direct gap outputs are produced in the semiconductor diodes formed of these alloys, even though the alloys contain much more of the indirect gap material than the direct gap material. Thus at point 46 the alloy composition includes about four times as much of the indirect gap material GaP as it does of the indirect gap material InP. And the material is still, at this point, a direct gap alloy.

Semiconductor diodes of this alloy have been fabricated to emit green light by direct gap recombination using alloys grown from the melt. In one specific example, a crystal of such an alloy has been prepared, doped with the N-type impurity tellinium, and thereafter by diffusion of zinc, a P-type impurity, a PN junction has been formed in the material and the device completed and operated as described above with reference to FIG. 1.

Figure 4:
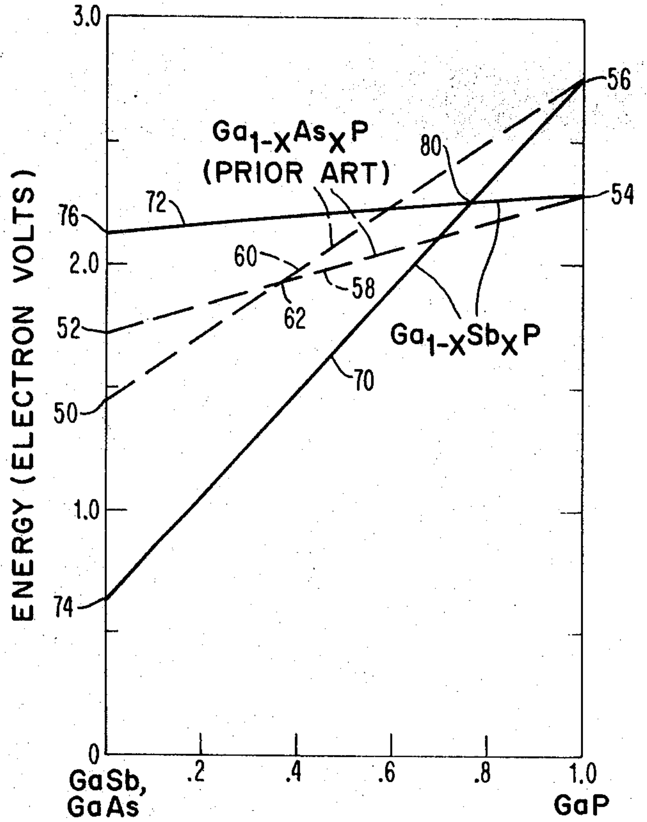
FIG. 4 is a graphical representation of the energy characteristics of the alloy system $Ga_{1-x}Sb_xP$ and the prior art alloy system $Ga_{1-x}As_xP$, and illustrates the advantages of the former over the latter.

The importance of the above-discussed parameters is further illustrated in FIG. 4. In this figure, the energy characteristics of the alloy system $Ga_{11X}Sb_XP$ are plotted and compared with the characteristics of the prior art alloy $Ga_{11X}As_XP$. GaAs is a direct gap material having a direct or aligned conduction band minimum of about 1.43 electron volts (point 50) and misaligned minima at about 1.70 electron volts (point 52). GaP is an indirect gap material, as described above, having indirect conduction band minima at 2.26 electron volts (point 54) and a direct gap conduction minimum at 2.74 electron volts (point 56). Straight line curves representing the prior art GaAs–GaP alloy system are designated 58 and 60 in FIG. 2 and these curves intersect at a point 62. Semiconductor diodes of this alloy where X equals about 0.35 have been fabricated to produce light outputs at energies of about 1.89 electron volts. It should be carefully noted that in this prior art system the difference between the energy levels for GaAs represented at 50 and 52 is appreciably smaller than the difference in the energy levels represented at 54 and 56 for GaP.

When according to the teaching of the present invention an alloy is formed of GaSb, a direct gap semiconductor, and GaP, the straight line curves for the system are represented by lines 70 and 72 in FIG. 4. The direct gap material GaSb has a much lower direct gap than GaAs about 0.72 electron volts (point 74). However, the indirect conduction band minima in this material is at 2.1 electron volts (point 76). The difference between the energy levels represented at 74 and 76 for GaSb is much greater than the difference in the energy levels for the indirect gap material GaP represented at 54 and 56. Therefore, curves 70 and 72 intersect at a point far to the right hand side of the drawing, here designated 80, and it is possible to form alloys of these compositions which produce direct gap efficient radiation at energies as high as 2.21 electron volts.

Thus, it becomes clear that in forming an alloy for an electroluminescent diode, one of the most important criteria is the energy of the indirect conduction band minima in the direct gap constituent of the alloy. This is so even though this minima is not, per se, involved in the recombination radiation transitions regardless of whether the material is used in a pure or an alloy form.

Figure 5:
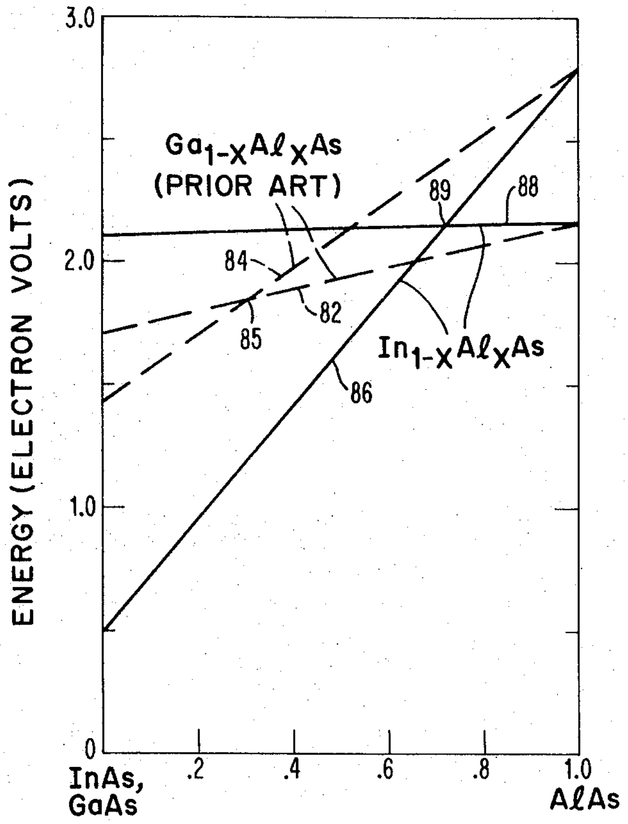
FIG. 5 is a graphical representation of the energy characteristics of the alloy system $In_{1-x}Al_xAs$ and the prior art system $Ga_{1-x}Al_xAs$ and illustrates the advantages of the former over the latter.

A further illustration of the advantages of the alloy systems according to the present invention of the alloy system is illustrated in FIG. 5. In this figure, the dashed lines 82 and 84, which intersect at point 85, represent the prior art system $Ga_{1-x}Al_xAs$. The full lines 86 and 88, intersecting at point 89, represent the alloy system $In_{1-x}Al_xAs$. It is clear from the diagram that higher energy and more visible electroluminescent outputs can be realized with the InAs–AlAs alloy. This follows as before from the fact that the difference in the energy levels for the direct and indirect conduction band minima in the direct gap material InAs are appreciably greater than the energy difference between the corresponding minima in the AlAs. As is evident from the plot, this is not the case for the GaAs–AlAs system, and therefore the intersection 85 of the lines 82 and 84 is far to the left on the drawing and the maximum direct gap light output realized is at about 1.83 electron volts. Curves 86 and 88, representing the InAs-AlAs system intersect far to the right of the drawing at point 89, illustrating that light outputs from direct transitions up to at least 2.14 electron volts are realizable with this system.

Figure 6:
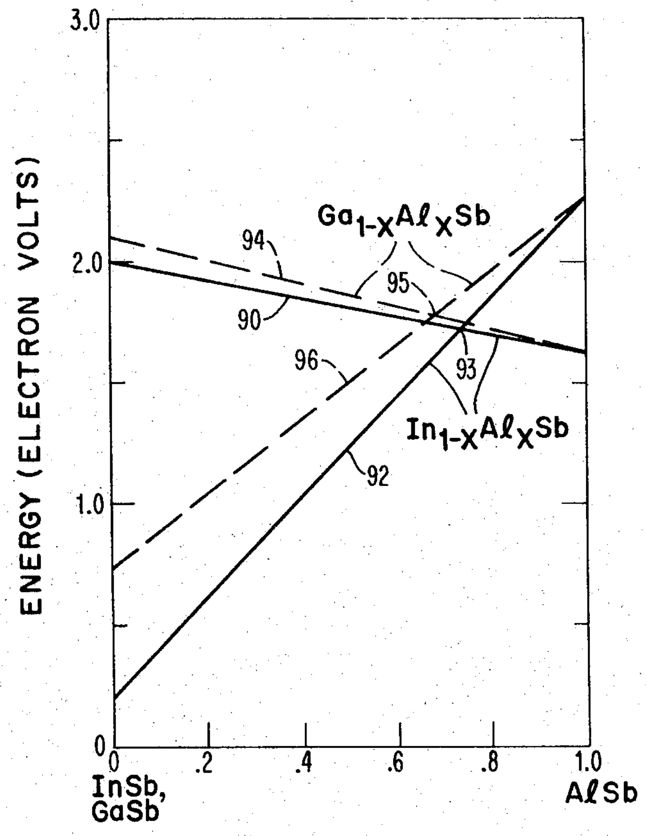
FIG. 6 is a graphical representation of the energy characteristics of the alloy systems $In_{1-x}Al_xSb$ and $Ga_{1-x}Al_xSb$, in each of which it is possible to produce alloys having direct gap transitions at higher energies than the direct and indirect gaps of the two component III–V components of the alloys.

In FIG. 6 two alloy systems according to the present invention are graphically represented. These systems differ from those discussed above in that it is possible to obtain direct gap recombination radiation from these alloys at a higher energy than is realizable either by direct or indirect transitions in either of the constituents of the alloy.

In FIG. 6, the straight line curves 90 and 92 are for the alloy $In_{1-x}Al_xSb$ and the curves 94 and 96 are for the system $Ga_{1-x}Al_xSb$. Curves 90 and 92 intersect at point 93 and curves 94 and 96 intersect at point 95. Particular note should be made of the fact that for both of these alloy systems the indirect aligned minima for the direct gap material (InSb or GaSb) is higher than the corresponding indirect or misaligned minima for the indirect gap material (AlSb). This being the case, both of the curves 90 and one alloy system and 94 for the other alloy system, slope upwards from right to left. Therefore, the maximum light output in terms of photon energy for each of these systems is higher than the recombination radiation that can be realized either by a direct gap transition in either InSb or GaSb alone or by an indirect gap transition in AlSb alone. In both systems the energy differences between the aligned and misaligned (direct and indirect) minima in the direct gap material is much greater than the energy differences between the corresponding minima in the indirect material. Though, in this type of system, it would be preferable if the direct gap energy of InSb or GaSb were higher and the intersection displaced to the left, no materials providing this type of energy relationship are known at this time.

The maximum energy output achievable for the alloys plotted in FIG. 6 is not as far in the visible as for the other alloy systems described above. Point 95 represents a maximum energy output of about 1.76 electron volts and point 93 a maximum output of about 1.70 electron volts. However, these alloys illustrate the manner in which significant improvements can be realized in semiconductor alloy diodes according to the present invention by properly choosing the constituents of the alloy to achieve the desired direct gap type of transition.

Figure 7:
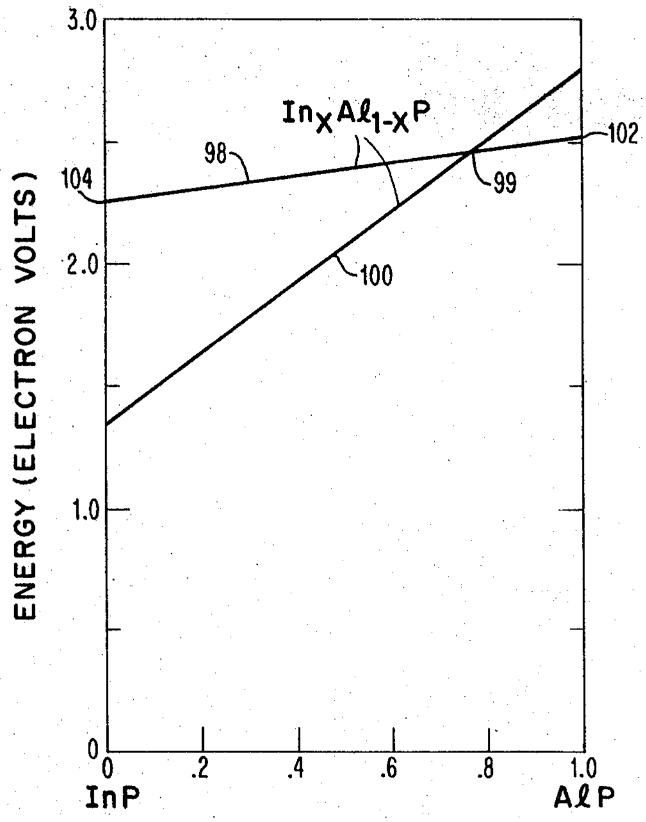
FIG. 7 is a graphical representation of the energy characteristics of the alloy system $In_xAl_{1-x}P$, which illustrates the possibility of direct gap recombination output from electroluminescent diodes at energies as high as 2.43 electron volts.

A further and final example is illustrated in FIG. 7. In this figure, the parameters for the alloy system $In_XAl_{11X}P$ are plotted and are represented by the two straight line curves 98 and 100 which intersect at point 99, at an energy of about 2.43 electron volts which is the highest energy of any of the examples thus far given. This high energy is realized since the indirect gap of the material AlP is extremely high at 2.5 electron volts (point 102). In other respects, the alloy system of FIG. 8 is similar to those described above in that the difference in energy levels for the aligned and misaligned minima of the direct gap material InP is appreciably greater than the difference between the aligned and misaligned minima in the indirect material AlP. Further, as in the case in the other examples, the energy level of the misaligned minima in the direct gap material (point 104) is very close in energy to the energy of the misaligned minima of the indirect material AlP represented at 102. The energy at point 104 is about 90 percent of the energy at point 102. Further, as in the other examples given, the higher energy outputs are realized by direct gap radiative recombination for the alloy system of FIG. 7 when the alloy includes more than 50 percent of the indirect gap material AlP.

Though the description of the invention to this point has been primarily directed towards electroluminescent diodes, it should be understood that the application of the inventive principles are not limited to devices of this type. Other types of electroluminescent devices in which the carriers are injected by different electrical mechanisms or even by electron bombardment, may also be employed. However, the principle application of the invention is believed to be in the electroluminescent diodes described here in detail. Further, though as described above these alloyed diodes can be fabricated by growing an alloy from a melt and later doping by diffusion, it is also possible to prepare such devices by the well-known solution growth techniques which have been used to advantage in the preparation of electroluminescent diodes using other materials.

Again it should be noted that the principles of the invention are not restricted in their application to electroluminescent diodes of the type specifically described. As pointed out above, the alloys are of the type which may be useful to produce stimulated emission and therefore may be employed in injection laser structures.

Finally it is pointed out that some of the values of the energy for the conduction band minima are very difficult to measure and therefore actual values may vary somewhat from those disclosed. However, the energy relationships which are vital to the practice of the invention are as disclosed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a semiconductor recombination radiation device of the type which comprises a body of direct gap semiconductor material doped to include a PN junction across which a forward bias is applied to produce a light output by recombination radiation, the improvement comprising:

a. said direct gap semiconductor material being an alloy of a first III–V semiconductor selected from the group consisting of InP, GaSb, InAs and InSb and a second III–V semiconductor selected from the group consisting of GaP, AlAs, AlP and AlSb; and said alloy is selected from the group consisting of $In_{11x}Ga_xP$, $Ga_{11x}Sb_xP$, $In_{11x}$-$Al_xAs$, $In_xAl_{11x}P$, $Ga_{11x}Al_xSb$ and $In_{11x}Al_xSb$ and where x is about 0.5 to about 0.8;

b. said first semiconductor being a direct gap semiconductor having a first conduction band minimum aligned with the valence band maximum and a second conduction band minimum misaligned with the valence band maximum in the semiconductor and said second minimum being at a higher energy than said first minimum;

c. said second semiconductor being an indirect gap semiconductor having a first conduction band minimum aligned with the valence band maximum and a second conduction band minimum misaligned with the valence band maximum in the semiconductor and said second minimum being at a lower energy than said first minimum;

d. said valence band maximum, said first conduction band minimum, and said second conduction band minimum, respectively, being located in said first semiconductor in the same crystallographic position as the valence band maximum, first conduction band minimum, and second conduction band minimum in said second semiconductor, e. the energy difference between the first and second conduction band minima in said first direct gap semiconductor being greater than the energy difference between the first and second conduction band minima in said second semiconductor;

f. and the composition of said first and s second semiconductors in said semiconductor alloy being within a range of compositions for which the direct gap energy of the alloy is lower than the indirect gap energy of the alloy.

2. The recombination radiation device of claim 1 wherein the second conduction band minimum in said first semiconductor is at an energy which is at least 90 percent of the energy of the second conduction band minimum in said second semiconductor; and said recombination radiation is produced by direct transitions in said semiconductor alloy at an energy which is at least 85 percent of the energy of the indirect energy gap of said second semiconductor.

3. The recombination radiation device of claim 1 wherein the second conduction band minimum of said first semiconductor is at a higher energy than the second conduction band minimum of said second semiconductor and said recombination radiation is produced in said semiconductor alloy by direct gap transitions at an energy greater than the indirect gap of said second semiconductor.

4. The recombination radiation device of claim 1 wherein said direct gap semiconductor alloy includes a percentage of said second indirect gap semiconductor material which is greater than the percentage of said direct gap semiconductor material.

5. The recombination radiation device of claim 1 wherein said first semiconductor is indium phosphide, and said second semiconductor is gallium phosphide.

6. The recombination radiation device of claim 5 wherein said semiconductor alloy is $In_{11x}Ga_xP$, and X had a value between 0.60 and 0.80.

7. A semiconductor recombination radiation device comprising:

a. a body of direct gap semiconductor material having a P region and an N region and a PN junction therebetween;

b. and means connected to said body for applying a forward bias across said junction to produce a light output due to direct gap recombination radiation;

c. said direct gap semiconductor material being an alloy $In_{11x}GaP$;

d. and X having a value between 0.60 and .80.

8. The recombination radiation device of claim 7 wherein X is between 0.75 and 0.80 and said recombination radiation light output is in the green at an energy of about 2.2 electron volts.

9. In a semiconductor recombination radiation device of the type which comprises a body of direct gap semiconductor material doped to include a PN junction across which a forward bias is applied to produce a light output by recombination radiation, the improvement comprising:

a. said direct gap semiconductor material being an alloy of a first semiconductor selected from the group consisting of GaSb InP, InAs and InSb and a second semiconductor selected from the group consisting of GaP AlP, AlAs and AlSb, and said alloy is selected from the group consisting of $In_{1-x}Ga_xP$, $Ga_{1-x}Sb_xP$, $In_{1-x}Al_xAs$, $In_xAl_{1-x}P$, $Ga_{1-x}Al_xSb$ and $In_{1-x}Al_xSb$ and where $x$ is about 0.5 to about 0.8;

b. said first semiconductor being a direct gap semiconductor having a first conduction band minimum aligned with the valence band maximum and a second conduction band minimum misaligned with the valence band maximum in the semiconductor and said second minimum being at a higher energy than said first minimum;

c. said second semiconductor being an indirect gap semiconductor having a first conduction band minimum aligned with the valence band maximum and a second conduction band minimum misaligned with the valence band maximum in the semiconductor and said second minimum being at a lower energy than said first minimum;

d. and the second conduction band minima in said first semiconductor being at an energy which is at least 90 percent of the energy of the second conduction band minima in said second semiconductor.

10. The recombination radiation device of claim 9 wherein the second conduction band minimum of said first semiconductor is at a higher energy than the second conduction band minimum of said second semiconductor and said recombination radiation is produced in said semiconductor alloy by direct gap transitions at an energy greater than the indirect gap of said second semiconductor.

11. In a semiconductor recombination radiation device of the type in which charge carriers of one conductivity type are introduced into a body of semiconductor material of opposite conductivity type to produce recombination radiation, the improvement comprising:

a. said direct gap semiconductor material being an alloy of a first semiconductor selected from the group consisting of GaSb, InP, InAs and InSb and a second semiconductor selected from the group consisting of GaP A1P, A1As, and A1Sb, and said alloy is selected from the group consisting of $In_{1-x}Al_xSb$, $In_{1-x}Ga_xP$, $Ga_{1-x}Sb_xP$, $In_{1-x}Al_xAs$, $In_xAl_{1-x}P$, and $Ga_{1-x}Al_xSb$ and where $x$ is about 0.5 to about 0.8;

b. Said first semiconductor being a direct gap semiconductor having a first conduction band minimum aligned with the valence band maximum and a second conduction band minimum misaligned with the valence band maximum in the semiconductor and said second minimum being at a higher energy than said first minimum;

c. said second semiconductor being an indirect gap semiconductor having a first conduction band minimum aligned with the valence band maximum and a second conduction band misaligned with the valence band maximum in the semiconductor and said second minima being at a lower energy than said first minimum;

d. the composition of said alloy including a greater percentage of said second indirect gap semiconductor than that of said first direct gap semiconductor than that of said first direct gap semiconductor but being within a range of compositions for which the direct gap energy of the alloy is lower than the indirect energy gap.

PO-1050 (5/69)

UNITED STATES PATENT OFFICE
CERTIFICATE OF CORRECTION

Patent No. 3,614,549 Dated October 19, 1971

Inventor(s) Max R. Lorenz and Arthur H. Nethercot, Jr.

It is certified that error appears in the above-identified patent and that said Letters Patent are hereby corrected as shown below:

In the Abstract, line 5, "GaP" first occurrence should be --gap --; line 7, "gap" should be -- GaP --.

Col. 1, line 28, "gas" should be -- of --; line 58, "$In_{11X}Ga_X$" should be -- $In_{1-X}Ga_X$ --.

Col. 2, line 3, "$Al_X$", first occurrence, should be deleted; lines 3, 4, 31, 36, 38, 39, 42, 43, 46 and 51, each occurrence, "$_{11X}$" should be -- $_{1-X}$ --.

Col. 3, line 29, "$_{11X}$" should be -- $_{1-X}$ --; line 49, "(000)" should be -- (100) --.

Col. 4, line 43, "$_{11X}$" should be -- $_{1-X}$ --.

Col. 5, lines 39 & 40, "$_{11X}$" should be --$_{1-X}$--.

Col. 6, line 63, "$_{11X}$" should be -- $_{1-X}$ --.

Col. 7, lines 53 & 54, each occurrence, "$_{11X}$" should be --$_{1-X}$--.

Col. 8, line 34, "had" should be --has--; "$_{11X}$" should be --$_{1-X}$--; line 44, "$_{11X}$" should be --$_{1-X}$--.

Signed and sealed this 20th day of February 1973.

(SEAL)
Attest:

EDWARD M.FLETCHER,JR.
Attesting Officer

ROBERT GOTTSCHALK
Commissioner of Patents